United States Patent [19]

Goto et al.

[11] Patent Number: 4,812,662

[45] Date of Patent: Mar. 14, 1989

[54] ALIGNMENT SYSTEM USING AN ELECTRON BEAM

[75] Inventors: Susumu Goto, Hachiohji; Yuichi Kumabe, Atsugi; Masahiko Okunuki, Itsukaichimuchi, all of Japan

[73] Assignee: Canon Kabushiki Kaisha, Tokyo, Japan

[21] Appl. No.: 9,872

[22] Filed: Feb. 2, 1987

[30] Foreign Application Priority Data

Feb. 6, 1986 [JP] Japan .................................. 61-024653

[51] Int. Cl.$^4$ ...................... G01B 15/00; H01L 21/66
[52] U.S. Cl. ................................ 250/491.1; 250/492.2
[58] Field of Search ............. 250/491.1, 492.2, 492.24, 250/492.1; 356/103, 104

[56] References Cited

U.S. PATENT DOCUMENTS 3,210,101  1/1973  O'Keefe et al. .................. 250/492.2
3,745,358  7/1973  Firtz et al. ........................ 250/492.2
3,879,613  4/1975  Scott et al. ....................... 250/492.1

FOREIGN PATENT DOCUMENTS 61-148309  7/1986  Japan .

Primary Examiner—Bruce C. Anderson
Assistant Examiner—Paul A. Guss
Attorney, Agent, or Firm—Fitzpatrick, Cella, Harper & Scinto

[57] ABSTRACT

An alignment system for aligning a mask and a wafer each having an alignment mark, includes an irradiation system for irradiating the alignment marks of the mask and the wafer with an electron beam, a detecting system for detecting the amount of electron beam absorbed by the alignment marks, and an adjusting system for adjusting a relative position of the mask and the wafer, in accordance with the detection, so as to bring the mask and the wafer into a predetermined positional relation.

3 Claims, 7 Drawing Sheets

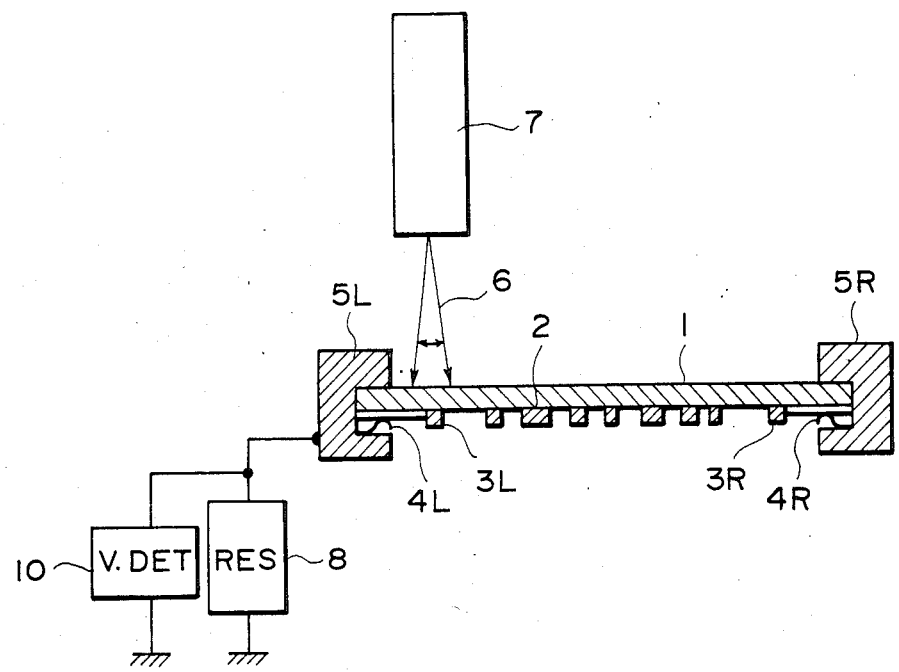
F I G. 1
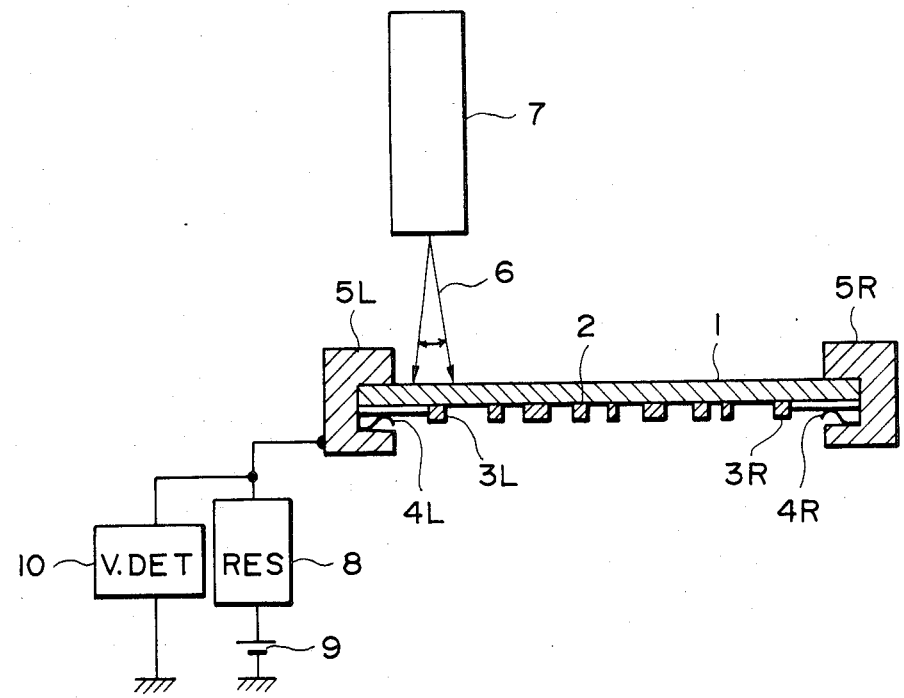
F I G. 2

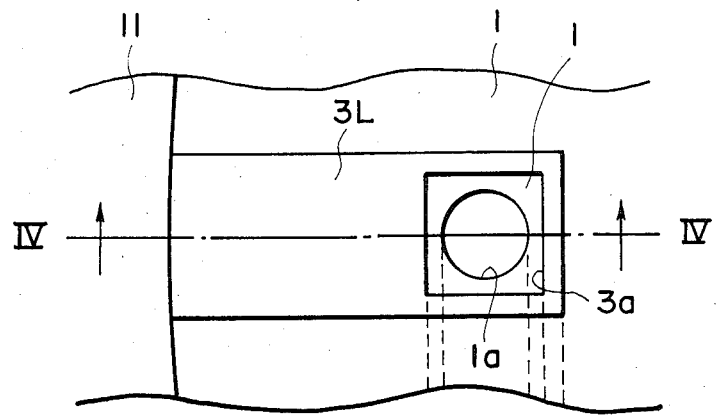
F I G. 4A
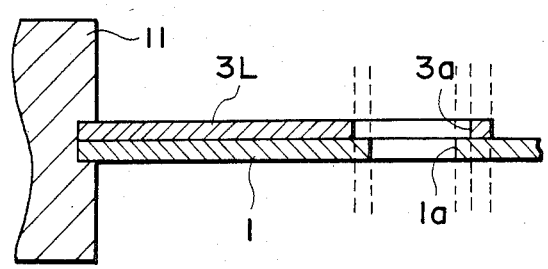
F I G. 4B
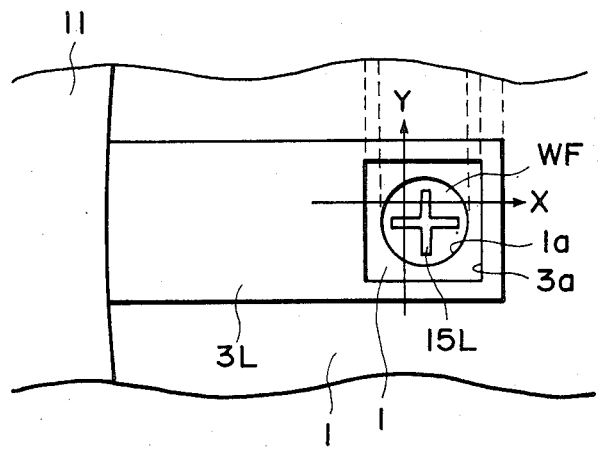
F I G. 4C

ALIGNMENT SYSTEM USING AN ELECTRON BEAM

FIELD OF THE INVENTION AND RELATED ART

This invention relates to an alignment system for aligning two objects such as a mask and a wafer in the process of manufacture of semiconductor devices such as integrated circuits. More particularly, the invention is concerned with an alignment system for detecting, by use of irradiation with an electron beam, alignment marks which are provided on predetermined positions on the mask and the wafer and which are made of electrically conductive or semiconductive materials, and for adjusting the relative position of the mask and the wafer in accordance with the detection of the alignment marks.

In the field of manufacture of semiconductor devices such as integrated circuits (ICs), large scaled integrated circuits (LSIs), etc., alignment and exposure apparatuses are used in lithographic or photolithographic processes. In these apparatuses, usually a laser beam is used to detect alignment marks formed on a mask (or reticle) and a wafer that is a subject to be photolithographically processed. More specifically, the alignment marks are irradiated with the laser beam, and lights reflected from the alignment marks are detected as mark detection signals. On the basis of the detection of these signals, high-accuracy alignment of the mask and the wafer is achieved.

In high-resolution X-ray exposure apparatuses that have been recently developed in an attempt to lithographically manufacturing high-capacity microcircuits, it is still difficult to assure sufficient alignment accuracy, as desired, by use of the laser beam.

SUMMARY OF THE INVENTION

It is accordingly a primary object of the present invention to provide an alignment system by which the inconveniences described above can be overcome.

It is another object of the present invention to provide an alignment device and method that assures high-sensitivity detection of alignment marks and thus sufficiently high accuracy alignment of a mask and a wafer.

Briefly, in accordance with the present invention, an alignment mark made of an electrically conductive or semiconductive material is irradiated with an electron beam and the amount of electron beam as absorbed by the alignment mark is directly detected in the form of an electric current, for example. This assures high-sensitivity detection of the alignment mark, i.e. detection with a good signal-to-noise ratio, and, as a result of which, ensures sufficiently high accuracy alignment.

Further, according to the present invention, the detection of the alignment mark is not based on detection of reflected electron or secondary electrons. Rather, it is based on direct detection of the amount of the electron beam absorbed by the alignment mark. Therefore, basically the alignment mark may be provided either on a surface of an object that is to be irradiated with the electron beam or on an opposite surface of the object. However, the alignment mark may preferably be formed on the surface of the object to be irradiated with the electron beam, because this is effective to avoid scattering of the electron beam within the material of the object, thus preventing deterioration of signals to be detected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view illustrating the principle of mask alignment in accordance with one aspect of the present invention.

FIG. 2 is similar to FIG. 1, but shows another example of mask alignment in accordance with another aspect of the present invention.

FIG. 4A is a fragmentary and enlarged plan view of the mask shown in FIG. 3.

FIG. 4B is a sectional view taken on line IV—IV in FIG. 4A.

FIG. 4C is similar to FIG. 4A, but shows an alignment mark formed on a wafer that can be observed through an opening formed on the mask.

DESCRIPTION OF THE PREFERRED EMBODIMENTS

Figure 3:
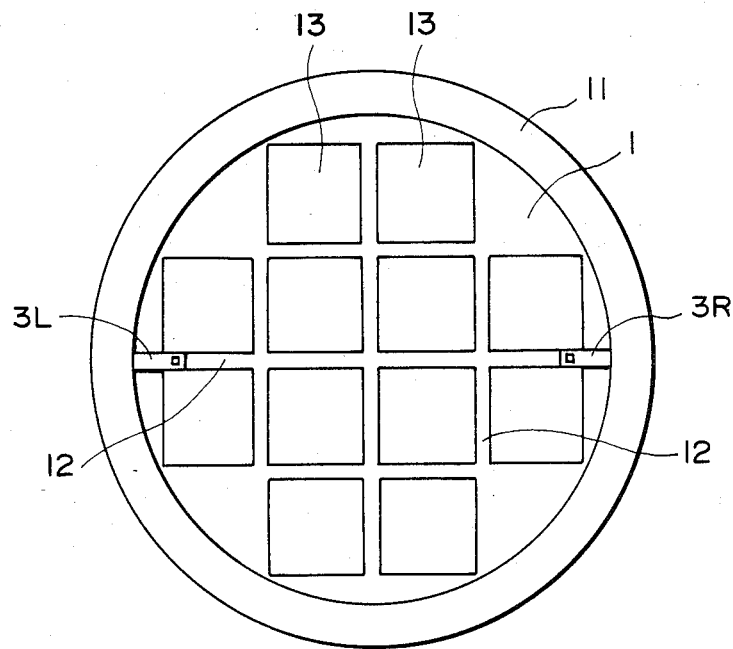
FIG. 3 is a plan view of a mask which is used in mask-to-wafer alignment in accordance with one aspect of the present invention.

Referring first to FIG. 1, description will now be made to the principle of mark detection in accordance with an aspect of the present invention. In this embodiment, the present invention is applied to a mark detecting system for use in a semiconductor device manufacturing X-ray exposure apparatus, for the mask alignment purpose.

In FIG. 1, a mask 1 for use in the X-ray exposure is formed by a thin film substrate made of an electrically insulative material such as, for example, polyimide or silicon nitride. The mask 1 has formed on its lower surface a plurality of circuit patterns 2 and two alignment marks 3L and 3R. Each of the marks 3L and 3R is made of an electrically conductive material so as to allow absorption of electrons.

The mask 1 is held by a mask holder 5 (5L and 5R) which, in this embodiment, is made of an electrically insulative material. The mask holder 5 is provided with two contact pawls 4L and 4R each of which is adapted to be brought into electrical contact with an associated one of elongated extensions (lead portions) for the marks 3L and 3R, respectively, when the mask 1 is held by the mask holder 5. These contact pawls 4L and 4R are arranged such that they do not contact with any one of the circuit patterns 2 formed on the mask 1. Such electrical isolation of the contact pawls 4L and 4R from the circuit patterns 2 can be attained in various manners. In the present embodiment, for this purpose, each of the marks 3L and 3R is formed on a scribe line defined between adjacent ones of such areas on the mask 1 that correspond to integrated circuit chips, respectively, while each of the lead portions for the marks 3L and 3R, respectively, is formed within the scribe line. Also, these lead portions are extended to a peripheral portion of the mask 1, such that they are brought into electrical contact with the contact pawls 4L and 4R, respectively, when the mask 1 is held by the mask holder 5.

An electron gun 7 is disposed above the mask 1 and is arranged to irradiate an electron beam 6 toward an upper surface of the mask 1. The electron beam 6 generated within the electron gun 7 is scanningly deflected, horizontally as viewed in FIG. 1, by an unshown deflecting electrode. Thus, in the state of FIG. 1, the electron beam 6 scans a portion of the mask 1 in which the mark 3L is formed. FIG. 1 is a cross-section taken along the line of scan, on the mask 1, by the electron beam 6. Accordingly, it is seen from FIG. 1 that the electron beam 6 scans only the mask 3L in the state of FIG. 1, but does not scan the lead portion for the mark 3L.

The mask holder 5 and the electron gun 7 are made relatively movable, such that, after completion of the scan of the mask portion in which the mark 3L is formed, another mask portion including the mark 3R can be scanned with the electron beam 6 in a similar manner.

The contact pawl 4L is electrically connected to an earth by way of a detecting resistor 8. With this arrangement, when the mask 1 portion having the mark 3L is scanned with the scanning electron beam 6 supplied from the electron gun 7, electrons are absorbed by the mark 3L and, as a result of which, an electric current (a current of absorbed electrons) is caused, from the contact pawl 4L to the earth via the detecting resistor 8. To this detecting resistor 8, a voltage detector 10 is electrically connected so as to detect an electric voltage to be produced at the resistor 8 by the above-described current of absorbed electrons. Thus, on the basis of information with respect to the position of scan by the scanning electron beam which is detectable at the time at which the peak of the voltage generated at the resistor 8 is detected by the detector 10, the position of the mark 3L in the scanning direction and relative to a specific reference position such as, for example, a scan start position is detectable. Such signal processing for the output of the detector 10 can be made in a known manner.

After completion of the above-described electron-beam scan for the mark 3L in one direction, the electron beam 6 is deflected in a direction perpendicular to the direction of deflection of the electron beam which has been made to scan the mark 3L in the aforesaid one direction, in order that the mark 3L is scanned again but in a direction which is contained in the plane of the mask 1 surface and which is perpendicular to the direction of the previously accomplished scan. By this, the position of the mark 3L with respect to two orthogonal directions contained in the plane of the mask 1 surface is detectable.

While not shown in the drawing, the mark detecting system of the present embodiment includes another resistor and another voltage detector, similar to the resistor 8 and the voltage detector 10, provided for the other mark 3R. After completion of the detection of the position of the mark 3L, the electron gun 7 and the mask holder 5 are relatively moved so that the mark 3R is scanned with the electron beam 6. Thus, on the basis of a current of absorbed electrons from the contact pawl 4R, the position of the mark 3R is detected in a similar manner. This is effective to detect the position of the mask 1 more precisely. It will be understood that, if the mask holder 5 is made of an electrically conductive material, the additional resistor and the additional voltage detector provided for the mark 3R in this embodiment may be omitted.

Referring now to FIG. 2, there is shown a mark detecting system according to a second embodiment of the present invention. In this embodiment, elements having corresponding or similar functions as of those of the FIG. 1 embodiment are denoted by the same reference numerals.

In the present embodiment, the mask holder 5 (5L and 5R) is made of an electrically conductive material and a DC power supply source 9 is provided in order to supply electric charges of positive polarity to each of the marks 3L and 3R. By this charge application, the marks 3L and 3R are maintained at a certain positive potential, as compared with the earth, and, as a result of which, a certain potential distribution is defined in the thin film substrate of the mask 1. As a matter of course, this potential distribution functions as a retarding field acting against to secondary electrons and reflected electrons which are to be generated from each of the marks 3L and 3R in response to the irradiation of the electron beam 6. As a result, a portion of the secondary electrons and/or the reflected electrons flows into the marks 3L and 3R. Therefore, a portion of the secondary electrons and/or the reflected electrons is mixed into the current of absorbed electrons, and the resultant current of electrons is directed to the detecting resistor 8 as a signal current. Thus, as compared with the first embodiment described with reference to FIG. 1, a mark detection signal with a higher sensitivity and a better signal-to-noise ratio is obtainable.

While, in the foregoing embodiments, the present invention has been described with reference to a case where the mark which is the subject of detection is formed on the lower surface of the object (i.e. the surface opposite to the surface of the object which is irradiated with the electron beam), the principle of mark detection of the present invention is, as a matter of course, effectively applicable to a case where the mark is formed on the upper surface of the object (i.e. the surface of the object which is to be irradiated with the electron beam).

Further, the principle of mark detection is effectively applicable also to a case where the object on which the mark is formed is made of an electrically conductive material. That is, it is known that, where the object is provided by an electrically conductive member having a surface irregularity and when the surface of such object is irradiated with an electron beam, the amount of emission of secondary electrons or reflected electrons from the irradiated surface changes in accordance with the shape of the surface of the object. Such change in the amount of emission of the secondary electrons or the reflected electrons appears as the change in the amount of absorption of the electrons, which is to be detected in the present invention. Therefore, on the basis of the change in the amount of absorption of the electron beam (or electrons), which appears when the mark formed on the electrically conductive object is scanned by the electron beam, the position of the mark can be detected substantially in the same manner as described with reference to the described embodiments. This means that the material of the object on which the mark is formed is not limited to be electrically conductive but may be semiconductive, provided that it allows detection of the absorbed electrons which is aimed at in the present invention. Similarly, the material of the mark to be formed on the object is not limited to be electrically conductive, and the mark may be made of any material provided that it allows absorption of electrons to a degree permitting the mark detection according to the present invention.

In accordance with the mark detecting principle used in the present invention, as has hitherto been described, a mark formed on an object is irradiated with an electron beam and the mark (particularly the position of the mark) is detected by detecting the amount of the electron beam (or electrons) absorbed by the mark. By doing so, high-sensitivity and high-accuracy detection of the mark with an improved signal-to-noise ratio is assured, regardless of whether the mark is formed on the upper surface of the object (the surface to be irradiated with the electron beam) or the mark is formed on the lower surface of the object (the surface opposite to the surface of the object to be irradiated with the electron beam).

Figure 5:
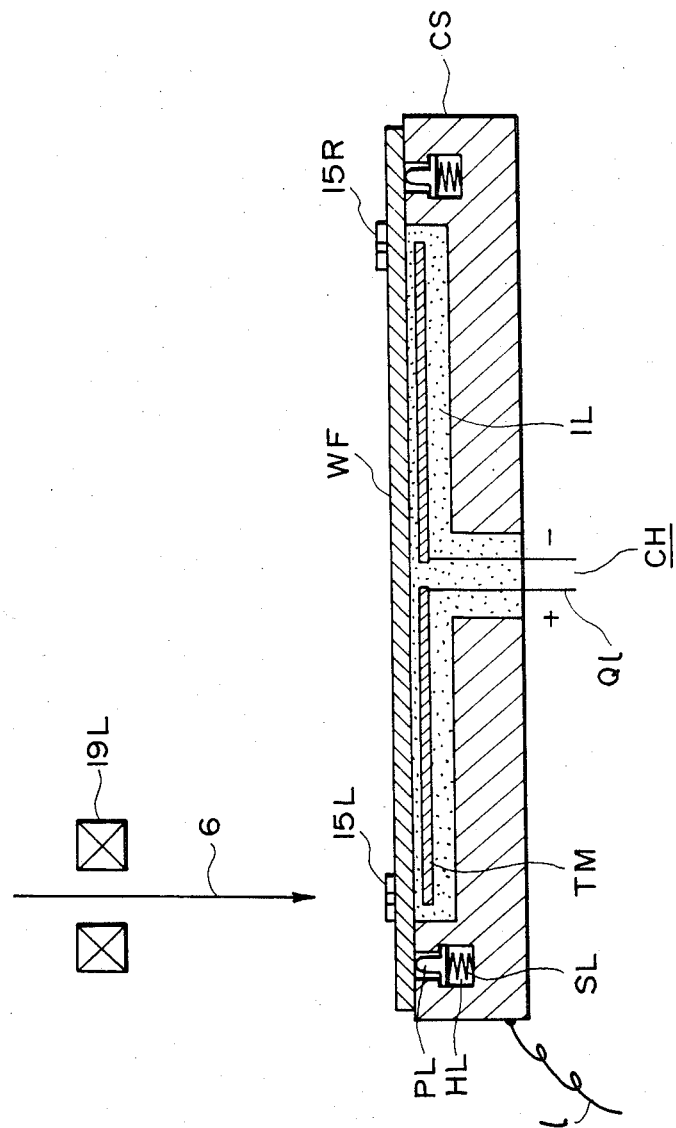
FIG. 5 is a sectional view of a wafer having alignment marks that are to be detected in accordance with one aspect of the present invention.

Referring now to FIGS. 3-5, description will be made to mask-to-wafer alignment in accordance with an embodiment of the present invention. Like numerals denote similar or corresponding elements.

In the case of FIG. 3, the mask 1 has actual element or circuit patterns 13—13 and alignment marks 3L and 3R, all of which are formed on an upper surface of the mask 1 that is to be irradiated with the electron beam, as compared with the cases of FIGS. 1 and 2. As illustrated in FIG. 3, the alignment marks 3L and 3R are formed on one of scribe lines 12—12. Similarly to the foregoing cases, each of the alignment marks 3L and 3R is made of a material having a good electrical conductivity, such as, for example, gold, tantalum, etc. These marks 3L and 3R are electrically contacted to a mask frame 11 made of metal. Thus, mark detection signals are detectable from the mask frame 11.

Each of the marks 3L and 3R is formed with an opening of rectangular shape, as is best seen at 3a in FIG. 4A. In alignment with these openings of the marks 3L and 3R, respectively, the substrate of the mask 1 has formed therein two circular openings, as is best seen at 1a in FIG. 4A, each having a diameter of approx. 20 microns. These openings of the mask 1 substrate are provided so as to allow passage of the electron beam 6 therethrough and irradiation, with the passed electron beam, of alignment marks formed on the wafer WF surface, as will be described later in more detail.

Where the alignment marks are formed on the lower surface of the mask 1 as in the cases of FIGS. 1 and 2, it is possible that the electron beam 6 is scattered within the material of the mask 1 such that the efficiency of irradiation of the alignment mark will be deteriorated to some degree. In the case as illustrated in FIGS. 3 and 4A-4C, on the other hand, the alignment marks can be irradiated with the electron beam which has not been scattered. Therefore, the irradiation efficiency is improved advantageously.

When one of the alignment marks, e.g. the mark 3L, is scanned with the electron beam 6 in one direction, e.g. in the direction of an X axis as illustrated in FIG. 4C, there occurs a current of absorbed electrons because the alignment mark is made of an electrically conductive material. As a result, by way of the mask frame 11 which is in electric contact with the alignment mark 3L (or 3R), a mark detection signal is obtainable at the detecting means such as the detector 10 shown in FIGS. 1 and 2.

The wafer alignment marks can be detected essentially in the same way as of the detection of the mask alignment marks. More specifically, where the surface of a semiconductor wafer having surface irregularity is irradiated with an electron beam, the amount of emission of secondary electrons or reflected electrons from the irradiated surface changes in accordance with the shape or contour of the surface being irradiated, as described in the foregoing. When the current of primary electrons of the electron beam is denoted by Ie, the current of secondary electrons is denoted by Is, and the current of reflected electrons is denoted by Ib, then the current of absorbed electrons (denoted by Isp) flowing from the wafer to the earth in response to the irradiation with the electron beam can be expressed as follows:

$$Isp = Ie - Is - Ib$$

From the above equation, it is understood that the waveform of the current of absorbed electrons is an inverted waveform of a signal that corresponds to the sum of the reflected electrons and the secondary electrons. Therefore, the waveform of the current of absorbed electrons bears information concerning the surface irregularity of the wafer.

In order to detect the secondary electrons and/or the reflected electrons, it is necessary to use specific detecting means such as a micro-channel plate or a secondary-electron multiplier. Also, an additional voltage source for driving the detector means is necessary. In accordance with the detection principle used in the present invention, as compared therewith, use of such detecting means and additional power source is unnecessary.

Description will now be made to detection of the wafer alignment marks, taken in conjunction with FIG. 5. The wafer WF is made of a semiconductive material and is placed on a wafer chuck CH. The wafer WF has a pair of alignment marks 15L and 15R which are formed on an upper surface of the wafer that is to be irradiated with the electron beam 6. Each of these alignment marks 15L and 15R has a shape of cross, as is best seen in FIG. 4C.

The wafer chuck CH, in this example, is of electrostatically attracting type and includes a peripheral portion CS made of an electrically conductive material to allow detection of an electric current from the lower surface of the wafer WF. The chuck CH further includes two opposed electrodes TM of semi-circular shape, in this example. Lead wires Q1 are connected to the electrodes TM, respectively, so as to supply electric charges of opposite polarities to the electrodes from voltage source means, not shown. By energizing the electrodes TM by way of the lead wires Q1, the wafer WF is electrostatically attracted to the chuck CH. The principle of such electrostatic attraction is effective even in a vacuum ambience. The electrostatically attracting electrodes TM are enclosed by an inner portion IL of the chuck that is made of an electrically insulative material.

Lead wire 1 is connected to the conductive portion CS of the wafer chuck CH, so as to allow detection of a current of absorbed electrons. The conductive portion CS has holes HL formed therein, in each of which a spring SL and an electrically conductive contact pin PL are accommodated. The contact pin PL and the bottom of the hole HL are maintained in an electric contact by way of the spring SL. By means of the electrostatically attracting force of the wafer chuck and the biasing force of the springs SL, the tip ends of the contact pins PL are press-contacted to the lower surface of the wafer WF. By this, the tip ends of the contact pins PL break through an electrically insulative coating provided on the back surface of the wafer, so that they contact directly with the semiconductive material of the wafer WF. Thus, when the alignment mark 15L (or 15R) of the wafer WF is irradiated with the electron beam 6 being scanningly deflected by a deflecting electrode 19L, electrons are absorbed by the alignment mark 15L (or 15R) so that a current of absorbed electrons is caused along a path extending in the sequence of wafer WF, contact pin PL, spring SL, conductive material CS and lead wire 1.

Figure 6:
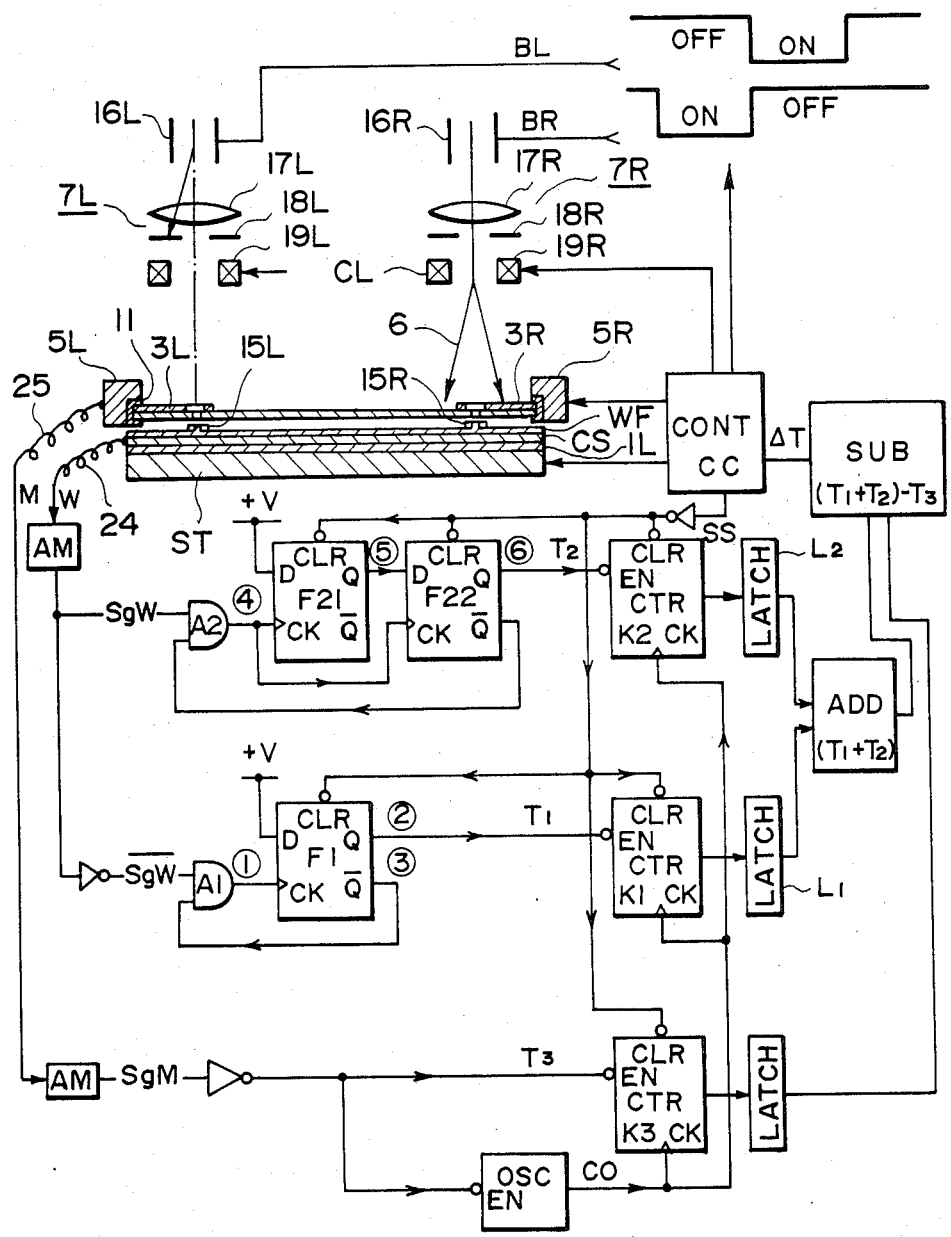
FIG. 6 is a schematic and diagrammatic view of an alignment system according to an embodiment of the present invention.
Figure 7:
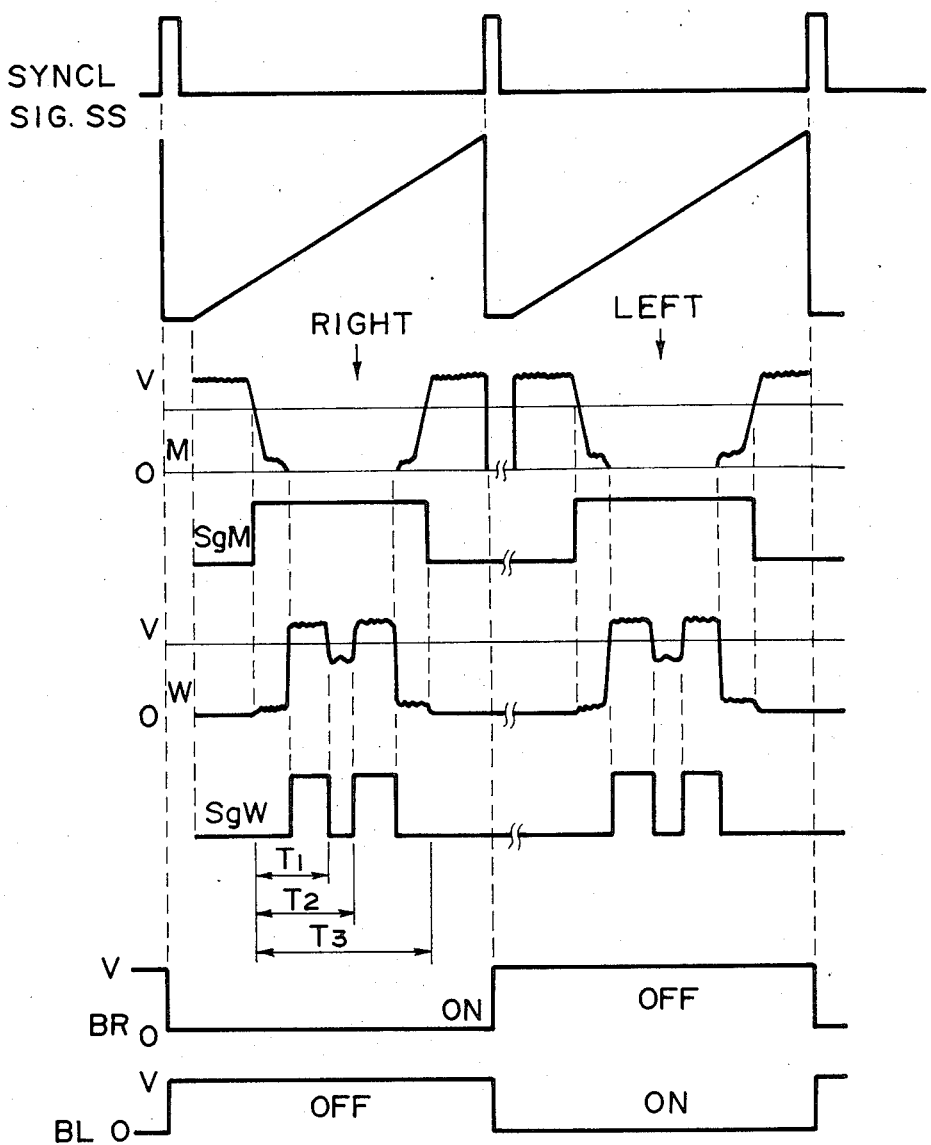
FIGS. 7 and 8 are waveform views, respectively, for explicating the alignment operation of the FIG. 6 embodiment.
Figure 8:
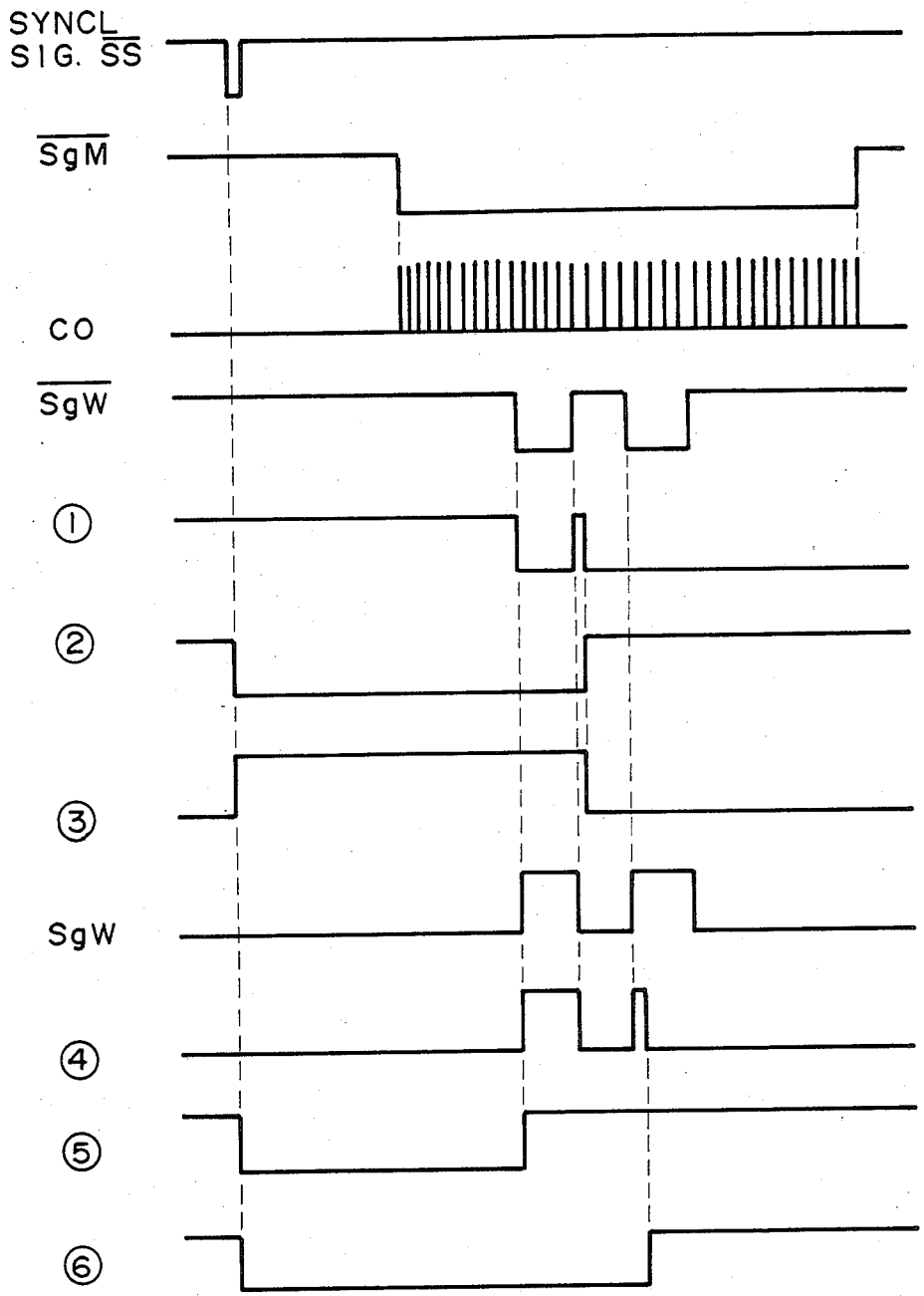

FIG. 6 shows a mask-to-wafer alignment system according to an embodiment of the present invention. FIGS. 7 and 8 are timing charts prepared for explicating the mark detecting operation of the alignment system shown in FIG. 6. In the FIG. 6 embodiment, like numerals as of those in the foregoing embodiments denote similar or corresponding elements.

As shown in FIG. 6, the alignment system of the present embodiment includes two electron guns 16L and 16R for irradiating, with electron beams 6, the left-hand marks (3L, 15L) and the right-hand marks (3R, 15R), respectively.

First, in operation, a control unit CC produces a sawtooth-wave signal and applies it to one of the deflecting coils 19L and 19R of deflecting coil unit CL so as to scan the mask alignment mark 3L (or 3R) with the electron beam 6 in one direction, e.g. the direction of X axis. When, for example, the alignment mark 3L is irradiated with the electron beam 6, a current of absorbed electrons denoted at M in FIG. 6 is caused because the alignment mark 3L is formed of a material having good conductivity, as described hereinbefore. The absorbed electrons flow into a wave-shaping circuit AM by way of the mask frame 11 and the holder portion 5L which are in electric contact with the mark 3L, and via a lead wire 25. The wave-shaping circuit AM comprises an amplifier of current/voltage conversion type, a comparator and so on, and produces an output having a signal waveform such as illustrated at SgM in FIG. 7. On the other hand, detection of the wafer alignment mark 15L is executed on the basis of irradiation of the wafer surface with the electron beam 6 that has passed through the opening, such as at 1a in FIGS. 4A-4C, formed in the mask 1 substrate. In preparation for this mask-to-wafer alignment, optical prealignment has been executed at a prestage so as to relatively coarsely position the wafer WF relative to the mask 1, in order to assure that the wafer alignment mark 15L (or 15R) can be observed through the corresponding opening, such as at 1a, formed in the mask 1, as is best seen in FIG. 4C. Therefore, at the time of mask-to-wafer alignment using the electron beam 6, the electron beam 6 passed through the opening 1a of the mask 1 surely impinges on the wafer alignment mark 15L. As a result, a mark detection signal (current of absorbed electrons) W in regard to the wafer alignment mark 15L is inputted, via a lead wire 24, into a wave-shaping circuit AM which is provided in connection with the detection of the wafer alignment mark. Thus, the wave-shaping circuit AM produces an output having a signal waveform such as illustrated at SgW in FIG. 7.

From the two kinds of output signals SgM and SgW, time periods T1, T2 and T3 shown in FIG. 7 are determined. If the mask and the wafer are accurately aligned with each other, equation "$(T1+T2)/2=(T3/2)$" and, therefore, equation "$T1+T2=T3$" are satisfied. If they are not aligned, the time periods T1, T2 and T3 are in a relation "$T1+T2>T3$" or in a relation "$T1+T2<T3$". The sign of inequality denotes the direction of deviation.

In order to calculate the lengths of the time periods T1, T2 and T3, the wafer mark detection signals SgW and $\overline{SgW}$ are inputted into D-type flip-flop circuits F1, F21 and F22, while the mask mark detection signal SgM is inputted into a counter K3. Also, output signals of the flip-flop circuits are applied to counters K1 and K2. As a result, the counters K1-K3 are "enabled". By counting clock signals from a clock signal generating circuit OSC during respective "count-enable" periods, binary-coded data corresponding to the time periods T1, T2 and T3 are obtained and they are stored into latches L1, L2 and L3, respectively. Thereafter, outputs of the latches L1 and L2 are supplied to an adder ADD so that it produces a binary-coded output corresponding to "$T1+T2$". On the other hand, the latch circuit L3 produces a binary-coded output corresponding to the time period T3, and such output of the latch L3 and the output of the above-described adder ADD are applied to a subtractor SUB. The subtractor SUB produces a binary-coded output that corresponds to "$\Delta T=T1+T2-T3$". The value of "$\Delta T$" denotes the amount of positional deviation between the mask and the wafer. Then, the control unit CC operates to move the mask 1 and/or a wafer stage ST carrying the wafer WF, by use of driving means (not shown), so as to remove the detected positional deviation $\Delta T$.

By executing the alignment detection, described above, for each of at least two points in regard to the mask and the wafer (i.e. at least two sets of alignment marks such as 3L, 15L; 3R, 15R) and also by executing such alignment detection while scanning the electron beam in two orthogonal directions (i.e. the directions of X and Y axes), the mask and the wafer can be aligned with each other with respect to the orthogonal X and Y directions as well as a rotational direction in a plane containing the X and Y directions. It is to be noted that the alignment or alignment detection is attainable by displacing the mask and the wafer, in place of deflecting the electron beam.

In the embodiment shown in FIG. 6, the conductive portion CS of the wafer chuck is provided by an integral member. For this reason, the alignment system of the present embodiment is arranged so that the wafer alignment marks 15R and 15L are detected in sequence. For such sequential detection, the pair of electron guns 7R and 7L are sequentially energized in response to sequential application of blanking signals BR and BL to beam-blanking electrodes 16R and 16L. In other words, the electron guns 7R and 7L are used alternately. Denoted in FIG. 6 at 17R and 17L are objective electronic lenses; and by 18R and 18L are aperture stops, all of which are of known type. Where the conductive portion CS is provided by two segments which are electrically isolated from each other, the electron guns 7L and 7R can be operated simultaneously so that the left-hand and right-hand alignment marks can be detected simultaneously.

In order to ensure the sequential mark-detection, the blanking signals BL and BR are so controlled that the blanking signal BL, for example, is rendered into "high level" (i.e. OFF-state) while the blanking signal BR is rendered into "low level" (i.e. ON-state). By this, the electron gun 7L is deactivated while the electron gun 7R is activated. Thus, the alignment system is brought into a first detection mode effective to detect the right-hand alignment marks 3R and 15R. The electron beam 6 from the right-hand electron gun 7R is first scanningly deflected in the X direction as shown in FIG. 4C such that, on the basis of the mask mark detection signal M and the wafer mark detection signal W, any positional deviation $\Delta X_R$ between the mask alignment mark 3R and the wafer alignment mark 15R in the X direction is detected. Subsequently, the electron beam 6 from the electron gun 7R is scanningly deflected in the Y direction, and any positional deviation $\Delta Y_R$ between the marks 3R and 15R in the Y direction is detected in a similar way. By this, detection of the right-hand alignment marks is completed. In response to this completion, the blanking signal BL is rendered into "low level" (i.e. ON-state) while the blanking signal BR is rendered into "high level" (i.e. OFF-state), in order to execute detection of the left-hand alignment marks. By this, the left-hand electron gun 7L is activated, whereby positional deviations $\Delta X_L$ and $\Delta Y_L$ are detected in a similar way. Also, any deviation component $\theta$ in the rotational direction is detectable from the results of detection of the left-hand and right-hand alignment marks, in a known manner.

In accordance with the present invention, as has hitherto been described, an alignment mark is detected by use of an electron beam and on the basis of detection of a current of absorbed electrons. As a result, the position of the alignment mark or the positional deviation between alignment marks can be detected very exactly. Therefore, two objects such as a mask and a wafer can be aligned with each other extraordinarily accurately. Therefore, the alignment system of the present invention is particularly suitably usable in an X-ray exposure apparatus having very high resolving power.

While the invention has been described with reference to the structures disclosed herein, it is not confined to the details set forth and this application is intended to cover such modifications or changes as many come within the purposes of the improvements or the scope of the following claims.

What is claimed is:

1. A device for detecting a relative position of first and second objects each having an electrically conductive mark, said device comprising:
    means for irradiating the marks of the first and second objects with an electron beam;
    detecting means for detecting the amount of electron beam absorbed by each of the marks of the first and second objects, said detecting means being connectable electrically to each mark so as to detect a current resulting from absorption by the marks of electrons from said electron beam; and
    means for detecting the relative position of the first and second objects on the basis of an output from said detecting means.

2. A device for aligning a mask and a wafer each having an electrically conductive alignment mark, said device comprising:
    means for irradiating the alignment marks of the mask and the wafer with an electron beam;
    detecting means for detecting the amount of electron beam absorbed by the alignment marks of the mask and the wafer, said detecting means being connectable electrically to each alignment mark so as to detect a current resulting from absorption by the alignment marks of electrons from said electron beam; and
    means for adjusting a relative position of the mask and the wafer, in accordance with an output from said detecting means so as to bring the mask and the wafer into a predetermined positional relation.

3. A method of aligning a mask having an electrically conductive alignment mark formed on its upper surface with a wafer having an electrically conductive alignment mark formed on its upper surface, said method comprising the steps of:
    irradiating the alignment marks of the mask and the wafer with an electron beam;
    electrically connecting detecting means to the alignment marks to permit detection of a current resulting from absorption by the alignment marks of electrons from the electron beam;
    detecting the amount of electron beam absorbed by the alignment marks of the mask and the wafer; and
    adjusting a relative position of the mask and the wafer in accordance with an output from said detecting step.

* * * * *

UNITED STATES PATENT AND TRADEMARK OFFICE
CERTIFICATE OF CORRECTION

PATENT NO. : 4,812,662
DATED : March 14, 1989
INVENTOR(S) : SUSUMU GOTO, ET AL.          Page 1 of 2

It is certified that error appears in the above-identified patent and that said Letters Patent is hereby corrected as shown below:

ON THE TITLE PAGE:

IN [56] REFERENCES CITED

U.S. PATENT DOCUMENTS, "3,210,101 1/1973 O'Keefe et al." should read --3,710,101 1/1973 O'Keeffe et al.--.

COLUMN 1

Line 20, "large scaled" should read --large-scale--.
    Line 35, "manufacturing" should read --manufacture--.

COLUMN 3

Line 17, "mask 3L" should read --mark 3L--.

COLUMN 4

Line 23, "to" should be deleted.

UNITED STATES PATENT AND TRADEMARK OFFICE
CERTIFICATE OF CORRECTION

PATENT NO. : 4,812,662
DATED : March 14, 1989
INVENTOR(S) : SUSUMU GOTO, ET AL.  -    Page 2 of 2

It is certified that error appears in the above-identified patent and that said Letters Patent is hereby corrected as shown below:

COLUMN 7

Line 4, "springs SL," should read --spring SL,--.

COLUMN 8

Line 28, "subtractor SUB." should read --subtracter SUB.-- and "subtractor SUB" should read --substracter SUB--.

COLUMN 9

Line 44, "many" should read --may--.

Signed and Sealed this

Twenty-seventh Day of February, 1990

*Attest:*

JEFFREY M. SAMUELS

*Attesting Officer*    *Acting Commissioner of Patents and Trademarks*